(12) United States Patent
Tai et al.

(10) Patent No.: US 11,908,833 B2
(45) Date of Patent: Feb. 20, 2024

(54) OVERLAPPING DIE STACKS FOR NAND PACKAGE ARCHITECTURE

(71) Applicant: Micron Technology, Inc., Boise, ID (US)

(72) Inventors: Enyong Tai, Singapore (SG); Hem P. Takiar, Fremont, CA (US); Li Wang, Singapore (SG); Hong Wan Ng, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/723,386

(22) Filed: Apr. 18, 2022

(65) Prior Publication Data

US 2022/0271007 A1    Aug. 25, 2022

Related U.S. Application Data

(63) Continuation of application No. 17/003,789, filed on Aug. 26, 2020, now Pat. No. 11,309,281.

(51) Int. Cl.
| | |
|---|---|
| *H01L 25/065* | (2023.01) |
| *H01L 23/00* | (2006.01) |
| *H01L 25/18* | (2023.01) |
| *H01L 25/00* | (2006.01) |

(52) U.S. Cl.
CPC .......... *H01L 25/0652* (2013.01); *H01L 24/45* (2013.01); *H01L 24/85* (2013.01); *H01L 25/18* (2013.01); *H01L 25/50* (2013.01); *H01L 2225/06562* (2013.01)

(58) Field of Classification Search
CPC ...... H01L 25/0652; H01L 24/45; H01L 24/85
See application file for complete search history.

(56) References Cited

U.S. PATENT DOCUMENTS

| | | | |
|---|---|---|---|
| 11,309,281 B2 | 4/2022 | Tai et al. | |
| 2006/0012018 A1 | 1/2006 | Karnezos et al. | |
| 2009/0273096 A1 | 11/2009 | Hiew et al. | |
| 2015/0200187 A1 | 7/2015 | Park et al. | |
| 2017/0345732 A1 | 11/2017 | Hung et al. | |
| 2018/0122771 A1* | 5/2018 | Park | H01L 25/0652 |
| 2018/0294249 A1 | 10/2018 | Watanabe et al. | |
| 2018/0342481 A1 | 11/2018 | Lee et al. | |
| 2019/0139934 A1 | 5/2019 | Ng et al. | |
| 2019/0229089 A1 | 7/2019 | Zhou et al. | |
| 2020/0075543 A1 | 3/2020 | Kosaka | |
| 2020/0126919 A1* | 4/2020 | Kang | H01L 23/3121 |
| 2021/0050328 A1 | 2/2021 | Lee | |

OTHER PUBLICATIONS

Office Action dated Jul. 11, 2022 of Taiwanese Patent Application No. 110131433, 13 pages (with translation).

* cited by examiner

*Primary Examiner* — Errol V Fernandes
(74) *Attorney, Agent, or Firm* — Perkins Coie LLP

(57) ABSTRACT

A semiconductor device assembly includes a substrate, a first stack of semiconductor dies disposed directly over a first location on the substrate, and a second stack of semiconductor dies disposed directly over a second location on the substrate and electrically coupled to a second subset of the plurality of external connections. A portion of the semiconductor dies of the second stack overlaps a portion of the semiconductor dies of the first stack. The semiconductor device assembly further includes an encapsulant at least partially encapsulating the substrate, the first stack and the second stack.

20 Claims, 7 Drawing Sheets

OVERLAPPING DIE STACKS FOR NAND PACKAGE ARCHITECTURE

CROSS-REFERENCE TO RELATED APPLICATION(S)

This application is a continuation of U.S. patent application Ser. No. 17/003,789, filed Aug. 26, 2020, now U.S. Pat. No. 11,309,281, which is incorporated herein by reference in its entirety.

TECHNICAL FIELD

The present technology generally relates to semiconductor packages, and more particularly relates to semiconductor packages including semiconductor die stacks with asymmetric heights.

BACKGROUND

Packaged semiconductor dies, including memory chips, microprocessor chips, and imager chips, typically include one or more semiconductor dies mounted on a substrate and encased in a plastic protective covering or covered by a heat-conducting lid. The die can include active circuits (e.g., providing functional features such as memory cells, processor circuits, and/or imager devices) and/or passive circuits (e.g., capacitors, resistors, etc.), as well as bond pads electrically connected to the circuits. The bond pads can be electrically connected to terminals outside the protective covering to allow the die to be connected to higher level circuitry.

Die manufacturers have come under increasing pressure to reduce the volume occupied by the dies and yet increase the capacity of the resulting encapsulated assemblies. To meet these demands, die manufacturers often stack multiple dies on top of each other to increase the capacity or performance of the device within the limited surface area on the circuit board or other element to which the dies are mounted.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1:
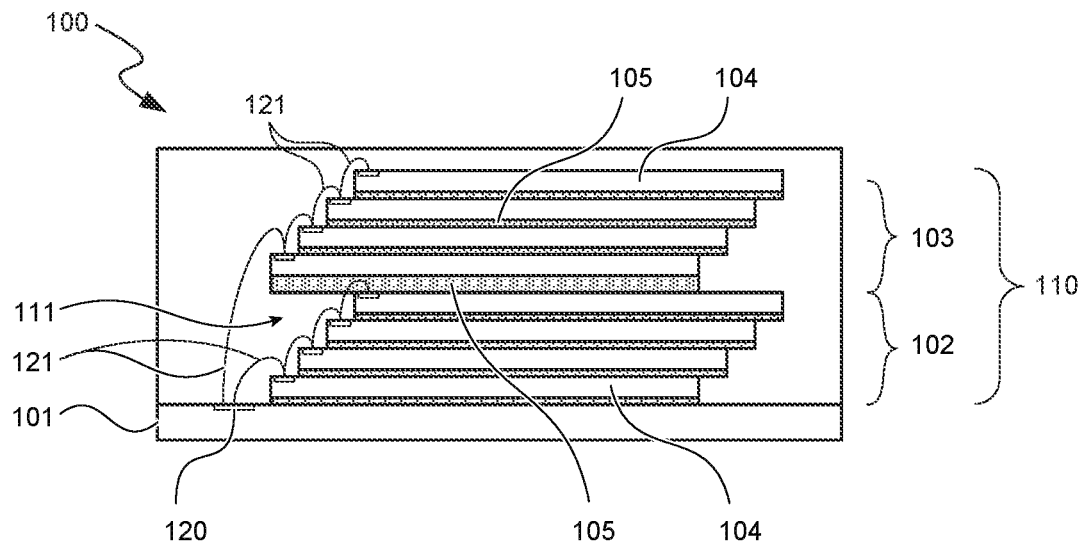
FIG. 1 illustrates a semiconductor device assembly including a shingled stack of semiconductor dies.

Specific details of several embodiments of semiconductor devices, and associated systems and methods, are described below. In some embodiments, for example, a semiconductor device configured in accordance with the present technology includes a substrate, a first stack of semiconductor dies disposed over a first location, and a second stack of semiconductor dies disposed over a second location. A portion of one or more uppermost semiconductor die of the second stack can superimpose (e.g., overlap) a portion of one or more uppermost semiconductor die of the first stack. The second stack can have a height that is different than a height of the first stack. The overlapping die stacks described herein can reduce the surface area on the substrate of which the dies occupy. The present technology can increase the capacity and/or performance of the device.

A person skilled in the relevant art will recognize that, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 3A-6. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

As discussed above, one approach to including additional semiconductor dies involves stacking the dies over the substrate. To facilitate the electrical connection of dies to the substrate, the dies can be arranged in a shingled stack, where each die is offset horizontally from a die below to leave exposed contact pads of the die that can be bonded (e.g., with a wirebond) to a corresponding bond pad on the substrate. A drawback of this shingled stacking approach is the limit on the number of dies that can be stacked in this fashion, due to the increasing amount of overhang of each additional die added to the stack.

Figure 2:
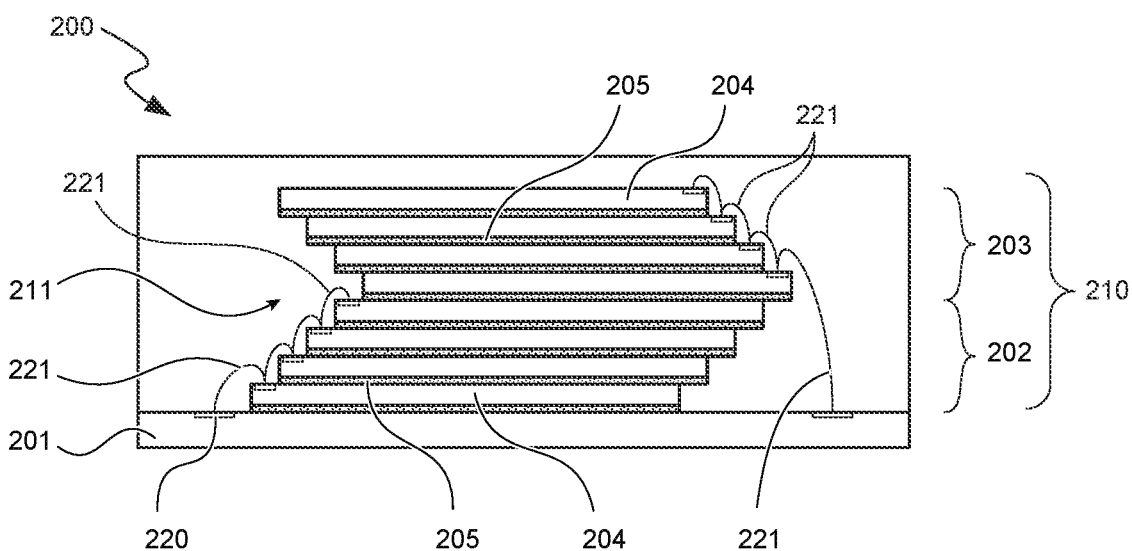
FIG. 2 illustrates a semiconductor device assembly including a shingled stack of semiconductor dies.

To address this limitation, shingled stacks of dies can include multiple groups of dies arranged in a shingled fashion, and offset either in the same direction (e.g., as shown in FIG. 1) or in opposing directions (as shown in FIG. 2). In this regard, FIG. 1 illustrates a semiconductor device assembly 100 in which a shingled stack 110 of dies on a substrate 101 includes first and second die groups 102 and 103, respectively, that each have individual dies 104, which are shingled in the same offset direction and electrically connected to bond pads 120 on the substrate 101 by wirebonds 121. The wirebonds 121 of the first die group 102 are underneath an overhang region 111 of the second die group 103, and therefore the lower wirebonds 121 are formed before the dies 104 of the second die group 103 are stacked over the first die group 102. Moreover, the bottommost die 104 of the second die group 103 is spaced above the topmost die 104 of the first die group 102 by a sufficient distance (e.g., provided by a thicker layer of die attach material 105) to form a wirebond 121 attached to the topmost die 104 of the first die group 102. Drawbacks of this arrangement include requiring multiple stacking and wirebonding operations that must be iteratively performed, as well as requiring a different die attach material thickness between the first and second die groups 102 and 103, which increases manufacturing costs and complexity.

FIG. 2 illustrates a semiconductor device assembly 200 having a shingled stack 210 of dies on a substrate 201 including first and second die groups 202 and 203, respectively, that each include individual dies 204, which are shingled in opposing offset directions and electrically connected to bond pads 220 on the substrate 201 by wirebonds 221. In this configuration, at least some of the wirebonds 221 of the first die group 202 are underneath an overhang region 211 of the second die group 203, and therefore the lower wirebonds 221 are formed before the dies 204 of the second die group 203 are stacked over the first die group 202. Drawbacks of this arrangement include requiring multiple stacking and wirebonding operations that must be iteratively performed, as well as requiring additional bond pads and traces in the substrate, which are expected to increase manufacturing costs and complexity.

Figure 3A:
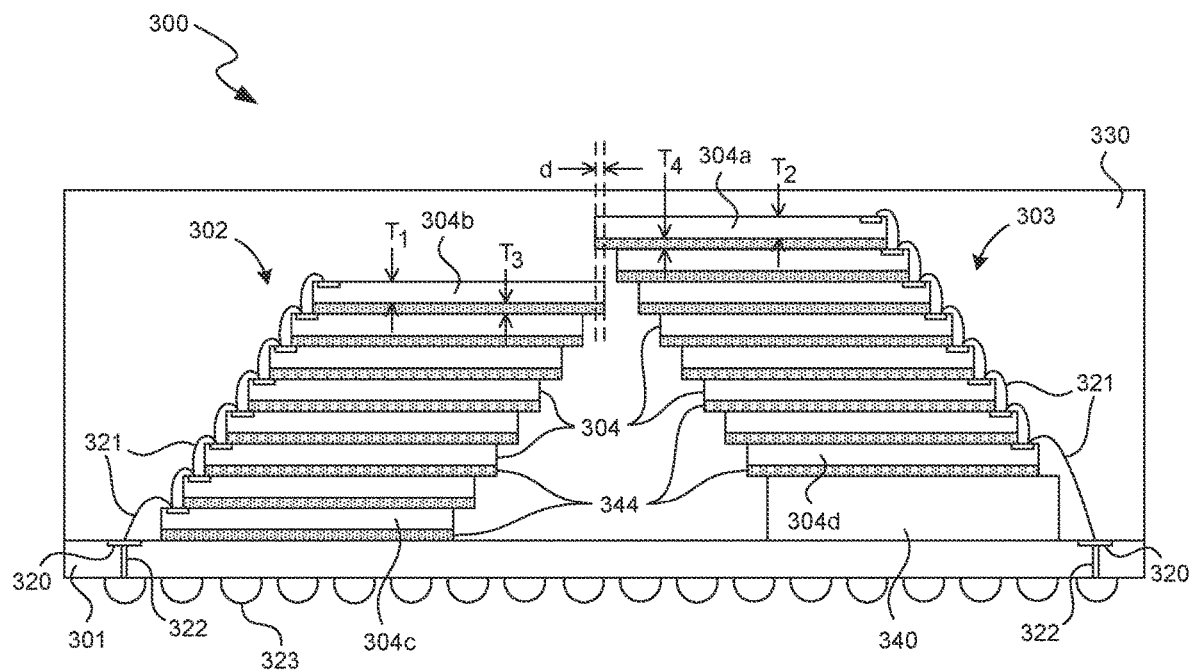
FIG. 3A is a simplified cross-sectional view of a semiconductor device assembly including overlapping stacks of semiconductor dies in accordance with an embodiment of the present technology.

FIG. 3A is a simplified cross-sectional view of a semiconductor device assembly ("assembly 300") including overlapping stacks of semiconductor dies in accordance with an embodiment of the present technology. The assembly 300 includes a substrate 301, a first stack 302 of semiconductor dies 304 ("dies 304"), a second stack 303 of dies 304, and an encapsulant 330 at least partially encasing the first and second stacks 302 and 303. Each of the first and second stacks 302 and 303 can include eight dies 304. In other embodiments, each of the first and second stacks 302 and 303 can include two, four, six, ten, twelve, or any other suitable number of dies 304. In other embodiments, the number of dies 304 of the first stack 302 can be different than the number of dies 304 of the second stack 303.

A bottommost (e.g., lowermost) die 304c and 304d of each stack 302 and 303, respectively, is directly electrically coupled to the substrate 301, and each die 304 in each stack 302 and 303, other than the bottommost die 304c and 304d, is laterally offset from immediately adjacent dies 304 by a lateral offset distance. In some embodiments, the offset distance from one die to the next is at least substantially equal throughout the separate stacks 302 and 303. In other embodiments, the offset distance can vary. The offset direction of each die 304 of the first stack 302 is opposite to the offset direction of each die 304 of the second stack 303.

The assembly 300 further includes wirebonds 321 electrically connecting the die 304 in each stack 302 and 303 to each other and/or the substrate 301. More particularly, each die 304 in each stack 302 and 303 is electrically coupled to one or more bond pads 320 on the substrate 301 either directly or indirectly, and the bond pads 320 are electrically coupled to corresponding external contacts of the assembly 300, such as solder ball 323, by vias 322 and/or other circuitry in the substrate 301. In this regard, because none of the dies 304 in either stack 302 and 303 are under an overhang of another die 304 (e.g., unlike in FIGS. 1 and 2), wirebonds 321 for all the dies in a stack can be formed in a single operation (e.g., uninterrupted by another stacking operation), and each bond pad 320 can be connected to only a single wirebond 321 (e.g., unlike in FIG. 1).

The assembly 300 includes overlapping die stacks 302 and 303 configured to improve capacity or performance of the assembly. As discussed above, the surface area on an element (e.g., substrate) to which dies are mounted can be limited. Accordingly, superimposing (e.g., overlapping) portions of the stacks 302 and 303 can reduce the amount of surface area on the substrate 301 occupied by the stacks 302 and 303. As a result, a higher density of dies 304 can be mounted on the substrate 301. In the illustrated embodiment, for example, the second stack 303 includes a height that is different than a height of the first stack 302 (e.g., the stacks 302 and 303 have asymmetric heights). The second stack 303 is taller than the first stack 302. A portion of the second stack 303 can be superimposed above (e.g., overlap) a portion of the first stack 302. For example, a portion of an uppermost die 304a of the second stack 303 is superimposed above (e.g., overlaps) a portion of an uppermost die 304b of the first stack 302 by an overlap distance "d." A greater overlap distance d can overcome the limitation of surface area space on the substrate 301 on which dies 304 are mounted.

Overlapping die stacks can reduce the surface area occupied by the dies mounted on the element (e.g., substrate) compared to die stacks without any overlap. As can be seen with reference to FIG. 3A, one die 304a of the second stack 303 overlaps one die 304b of the first stack 302. Overlapping one die of each stack can achieve a savings of approximately 270 microns. For example, the overlap distance d is about 270 microns. In other embodiments, two dies 304 of the second stack 303 can overlap one or more dies 304 of the first stack 302, which can achieve a savings of approximately 540 microns. Increasing the overall height of the second stack 303 can allow for more dies 304 of the second stack 303 to overlap one or more dies 304 of the first stack 302. Further, increasing the overall height of the second stack 303 can allow for a greater overlap distance d.

Overlapping die stacks 302 and 303 with asymmetric heights can be configured in a variety of different ways. In the illustrated embodiment, the assembly 300 further includes a spacer 340 (e.g., dielectric spacer, controller die, logic die, memory die, or any other suitable structure). The spacer 340 can be disposed at any suitable location within the second stack 303. For example, the spacer 340 is disposed underneath the bottommost die 304d of the second stack 303. In other embodiments, the spacer 340 can be disposed between any suitable die 304 of the second stack 303. The spacer 340 can have any suitable height. For example, the spacer 340 can have a height of about 5, 10, 20, 30, 40, 50, 60, 70, 80, 90, or 100 microns. In some embodiments, the spacer 340 can have a height of no more than 5, 10, 20, 30, 40, 50, 60, 70, 80, 90, or 100 microns. In some embodiments, the spacer 340 can have a height of at least 5, 10, 20, 30, 40, 50, 60, 70, 80, 90, or 100 microns.

Each die 304 is spaced apart from either an adjacent die 304, the substrate 301, or the spacer 340 by a die attach film 344. For example, the bottommost die 304d of the second stack 303 is spaced apart from the spacer 340 by the die attach film 344. Each die 304 of the first stack 302 and each die 304 of the second stack 303 includes a first and second die thickness $T_1$ and $T_2$, respectively. The first and second die thickness $T_1$ and $T_2$ can be at least approximately equal. Each die attach film 344 of the first stack 302 and each die attach film 344 of the second stack 303 includes a first and second die attach film thickness $T_3$ and $T_4$, respectively. The first and second die attach film thickness $T_3$ and $T_4$ can be at least approximately equal.

The assembly 300 can be manufactured in a variety of different ways. In some embodiments, for example, the assembly 300 is manufactured by providing the substrate 301, disposing the spacer 340 at a second location on the substrate 301, stacking the dies 304 on the substrate 301 to form the first stack 302, and stacking the dies 304 over the spacer 340 on the substrate 301 to form the second stack 303. In this regard, the dies 304 of the first stack 302 can be stacked directly over a first location on the substrate 301, and the dies 304 of the second stack 303 can be stacked directly over the spacer 340 at the second location on the substrate 301. The dies 304 of the first and second stacks 302 and 303 are wirebonded to the substrate 301, which can be performed subsequent to stacking the first and second stacks 302 and 303. The wirebonding can be performed in a single operation uninterrupted by any stacking. The stacks 302 and 303 of dies 304 can then be protected by an encapsulant 330.

Figure 3B:
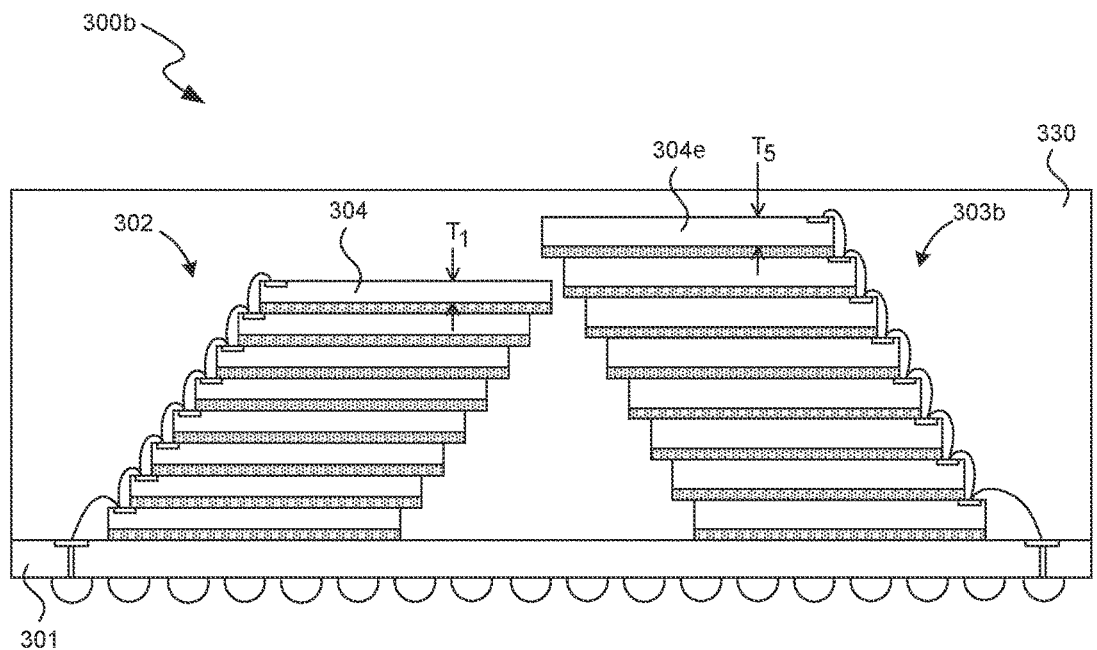
FIG. 3B is a simplified cross-sectional view of another semiconductor device assembly including overlapping stacks of semiconductor dies in accordance with an embodiment of the present technology.
Figure 3C:
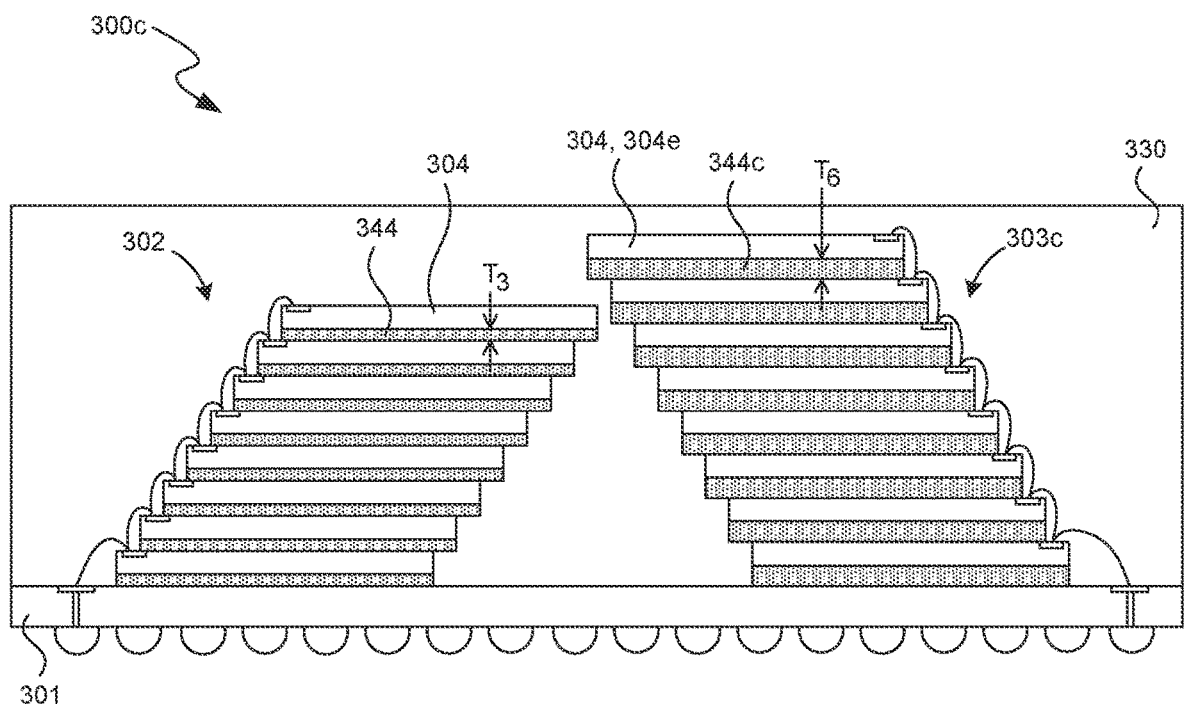
FIG. 3C is a simplified cross-sectional view of another semiconductor device assembly including overlapping stacks of semiconductor dies in accordance with an embodiment of the present technology.

FIGS. 3B and 3C illustrate semiconductor assemblies with various examples of overlapping die stacks configured in accordance with embodiments of the present technology. The assemblies shown in FIGS. 3B and 3C can be generally similar to the assembly 300 described with respect to FIG. 3A. Accordingly, like numbers are used to identify similar or identical components, and discussion of the assemblies shown in FIGS. 3B and 3C will be limited to those features that differ from the assembly 300 of FIG. 3A.

FIG. 3B illustrates a semiconductor device assembly 300b ("assembly 300b") including overlapping stacks of semiconductor dies in accordance with an embodiment of the present technology. A second stack 303b of semiconductor dies 304e ("dies 304e") is generally similar to the second stack 303 of FIG. 3A, except that a thickness $T_5$ of one or more dies 304e in the second stack 303b is different from the thickness $T_1$ of dies 304 in the first stack 302. Any suitable number of dies 304e of the second stack 303b can have the thickness $T_5$ different than the thickness $T_1$. In the illustrated embodiment, for example, all dies 304e have the thickness $T_5$ different than the thickness $T_1$. For example, the thickness $T_5$ can be greater than 100% of the thickness $T_1$. In some embodiments, the thickness $T_5$ can be about 110%, 120%, 130%, 140%, 150%, 160%, 170%, 180%, 190%, 200%, or 300% of the thickness $T_1$. In some embodiments, the thickness $T_5$ can be greater than 110%, 120%, 130%, 140%, 150%, 160%, 170%, 180%, 190%, 200%, or 300% of the thickness $T_1$. In some embodiments, thickness $T_5$ of each die 304e within the second stack 303b can be about equal to each other. In other embodiments, the thickness of $T_5$ of each die 304e within the second stack 303b can vary.

In other embodiments, not all dies 304e can have the thickness $T_5$ different than the thickness $T_1$. For example, the second stack 303b includes eight dies 304e, and one, two, three, four, five, six or seven dies 304e can have the thickness $T_5$ different than the thickness $T_1$. For example, the dies 304e, other than the bottommost, can have a thickness $T_5$ that is about equal to the thickness $T_1$, and the bottommost die 304e can have a thickness greater than the thickness $T_5$ and thickness $T_1$. In a further example, the semiconductor dies 304e, other than the two bottommost dies, can have the thickness $T_5$ about equal to the thickness $T_1$, and the two bottommost dies 304e in the second stack 303b can have a thickness greater than the thickness $T_5$ and thickness $T_1$. For example, the thickness of the bottommost die 304e and/or the two bottommost dies 304e can be about 110%, 120%, 130%, 140%, 150%, 160%, 170%, 180%, 190%, 200%, or 300% of the thickness $T_1$. In some embodiments, the thickness of the bottommost die 304e and/or the two bottommost dies 304e can be greater than 110%, 120%, 130%, 140%, 150%, 160%, 170%, 180%, 190%, 200%, or 300% of the thickness $T_1$.

The assembly 300b can be manufactured in a variety of different ways. In some embodiments, for example, the assembly 300b is manufactured by providing the substrate 301, stacking the dies 304 on the substrate 301 in the first stack 302, and stacking the dies 304e on the substrate 301 in the second stack 303b. In this regard, the dies 304 of the first stack 302 can be stacked directly over a first location on the substrate 301, and the dies 304e of the second stack 303b can be stacked directly at a second location on the substrate 301. The dies 304 and 304e of the first and second stacks 302 and 303b, respectively, are wirebonded to the substrate 301, which can be performed subsequent to stacking the first and second stacks 302 and 303b. The wirebonding can be performed in a single operation uninterrupted by any stacking. The stacks 302 and 303b are then protected by an encapsulant 330.

FIG. 3C illustrates a semiconductor device assembly 300c ("assembly 300c") including overlapping stacks of semiconductor dies in accordance with an embodiment of the present technology. A second stack 303c of dies 304 or 304e is generally similar to the second stack 303 of FIG. 3A or 303b of FIG. 3B, except that a die attach film 344c in the second stack 303c has a thickness $T_6$ different than the thickness $T_3$ of the die attach film 344 in the first stack 302. Any suitable number of die attach films 344c of the second stack 303c can have the thickness $T_6$ different than the thickness $T_3$. In the illustrated embodiment, for example, each die attach film 344c has the thickness $T_6$ different than the thickness $T_3$. For example, the thickness $T_6$ can be greater than 100% of the thickness $T_3$. In some embodiments, the thickness $T_6$ can be about 110%, 120%, 130%, 140%, 150%, 160%, 170%, 180%, 190%, 200%, or 300% of the thickness $T_3$. In some embodiments, the thickness $T_6$ can be greater than 110%, 120%, 130%, 140%, 150%, 160%, 170%, 180%, 190%, 200%, or 300% of the thickness $T_3$. In some embodiments, the thickness $T_6$ of each die attach film 344c within the second stack 303c can be about equal. In other embodiments, the thickness $T_6$ of each die attach film 344c within the second stack 303c can vary.

In other embodiments, not all die attach films 344c can have the thickness $T_6$ different than the thickness $T_3$. For example, the second stack 303c includes eight die attach films 344c, and one, two, three, four, five, six or seven die attach films 344c can have the thickness $T_6$ different than the thickness $T_3$. For example, the die attach films 344c, other than the bottommost, can have the thickness $T_6$ about equal to the thickness $T_3$, and the bottommost die attach film 344c can have a thickness greater than the thickness $T_6$ and thickness $T_3$. In a further example, the die attach films 344c, other than the two bottommost die attach films 344c, can have a thickness $T_6$ about equal to the thickness $T_3$, and the two bottommost die attach films 344c can have a thickness greater than the thickness $T_6$ and thickness $T_3$. For example, the thickness of the bottommost die attach film 344c and/or the two bottommost die attach films 344c can be about 110%, 120%, 130%, 140%, 150%, 160%, 170%, 180%, 190%, 200%, or 300% of the thickness $T_3$. In some embodiments, the thickness of the bottommost die attach film 344c and/or the two bottommost die attach films 344c can be greater than 110%, 120%, 130%, 140%, 150%, 160%, 170%, 180%, 190%, 200%, or 300% of the thickness $T_3$.

The assembly 300c can be manufactured in a variety of different ways. In some embodiments, for example, the assembly 300c is manufactured by providing the substrate 301, stacking the dies 304 on the substrate 301 in the first stack 302 while disposing the die attach film 344 between adjacent dies 304 of the first stack 302 and/or the substrate 301, and stacking the dies 304, 304e on the substrate 301 in the second stack 303c while disposing the thicker die attach film 344c between adjacent dies 304, 304e of the second stack 303c and/or the substrate 301. In this regard, the dies 304 of the first stack 302 can be stacked directly over a first location on the substrate 301, and the dies 304, 304e of the second stack 303c can be stacked directly at a second location on the substrate 301. The dies 304, 304e of the first and second stacks 302 and 303c, respectively, are wirebonded to the substrate 301, which can be performed subsequent to stacking the first and second stacks 302 and 303c. The wirebonding can be performed in a single operation uninterrupted by any stacking. The stacks 302 and 303c are then protected by an encapsulant 330.

Figure 4A:
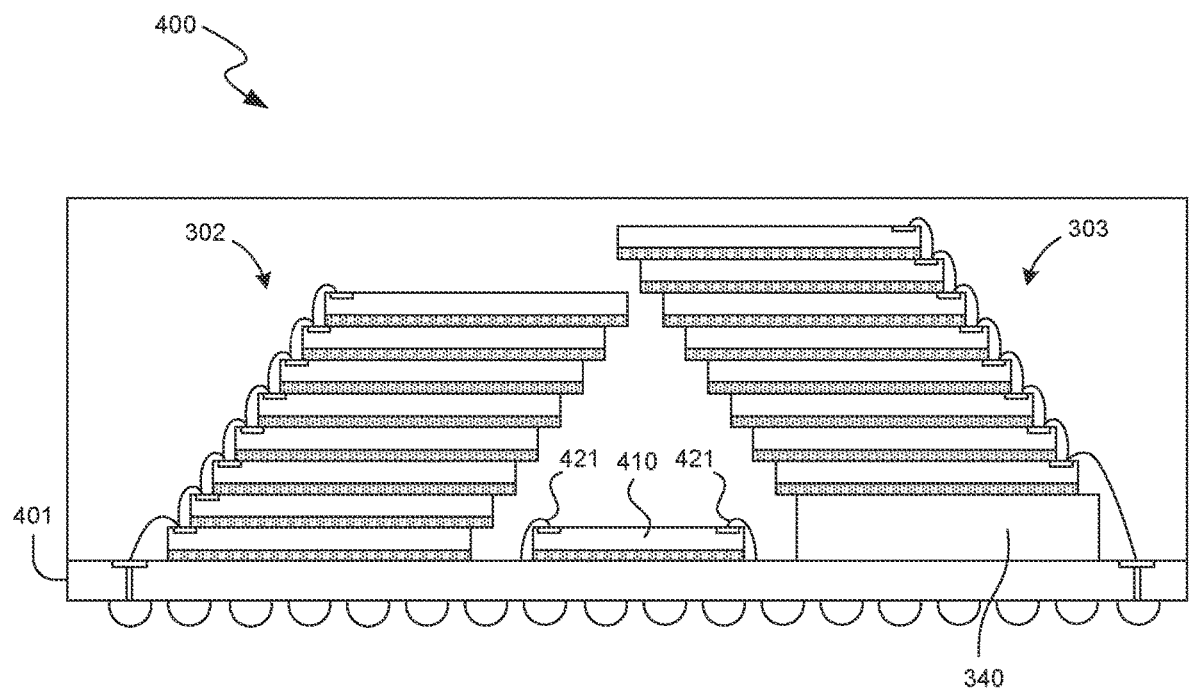
FIG. 4A is a simplified cross-sectional view of a semiconductor device assembly including the overlapping stacks of semiconductor dies of FIG. 3A, respectively, in accordance with an embodiment of the present technology.
Figure 4B:
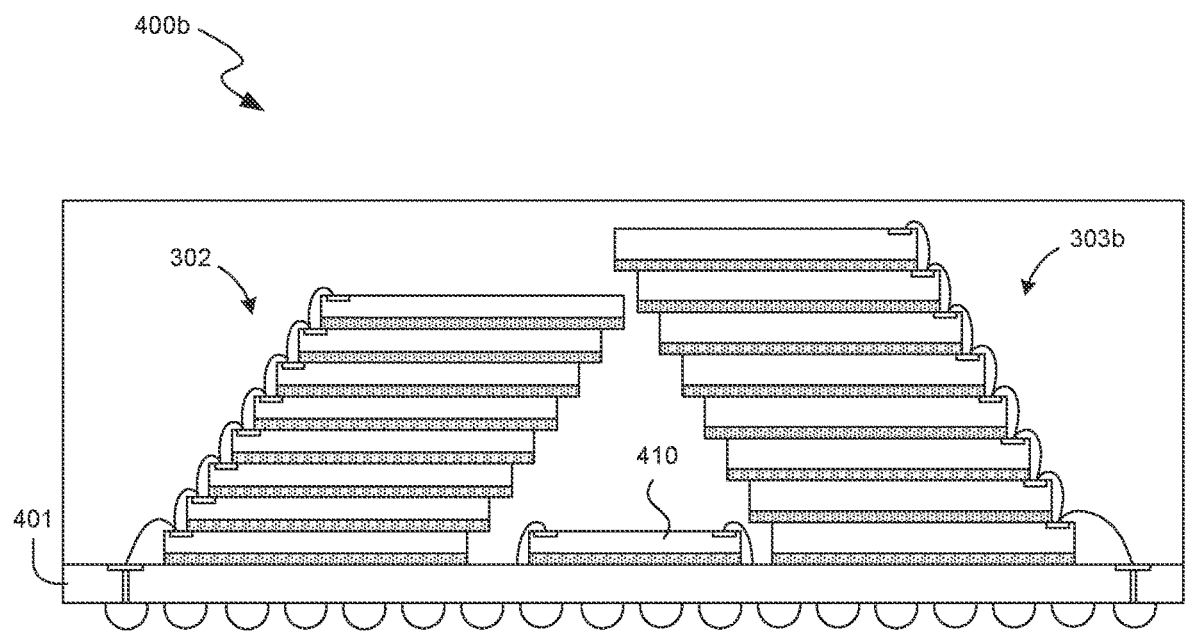
FIG. 4B is a simplified cross-sectional view of a semiconductor device assembly including the overlapping stacks of semiconductor dies of FIG. 3B, respectively, in accordance with an embodiment of the present technology.
Figure 4C:
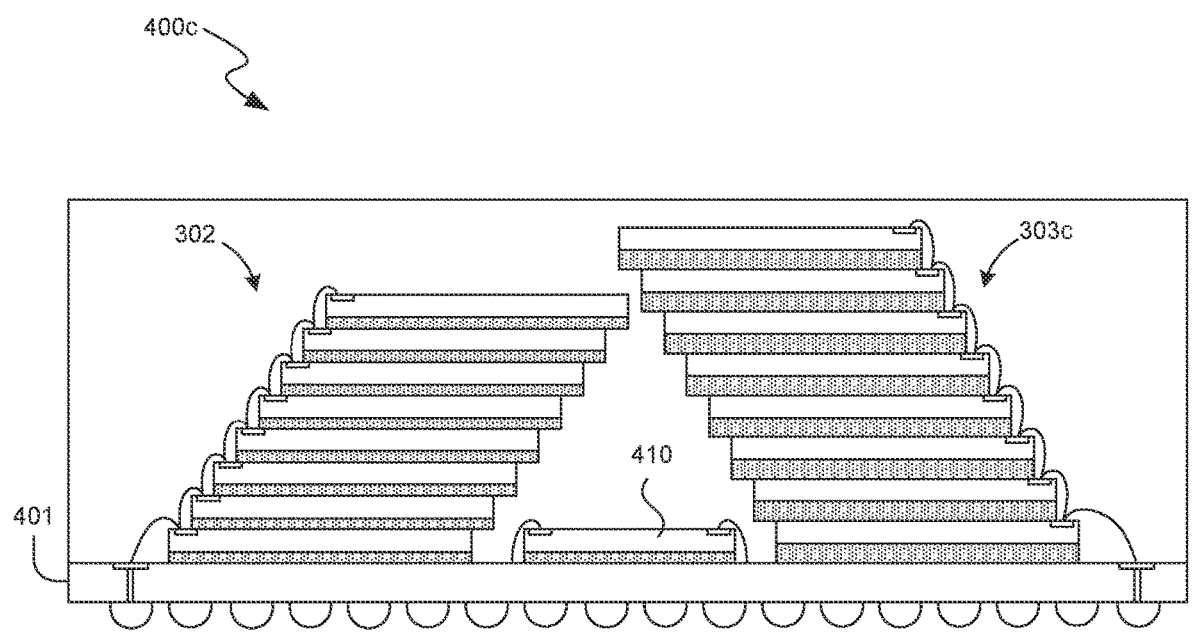
FIG. 4C is a simplified cross-sectional view of a semiconductor device assembly including the overlapping stacks of semiconductor dies of FIG. 3C, respectively, in accordance with an embodiment of the present technology.

FIGS. 4A-4C illustrate various semiconductor device assemblies 400, 400b, and 400c ("assemblies 400, 400b, and 400c") including the overlapping stacks of semiconductor dies of FIGS. 3A-3C, respectively, in accordance with an embodiment of the present technology. According to one aspect of the subject technology, another advantage including overlapping stacks of semiconductor dies in a semiconductor device assembly is the additional flexibility provided in the layout of the assembly for additional device hardware to be included. The layout of the assembly provides a distance between the bottommost semiconductor die of the first stack 302 and the bottommost semiconductor die of the second stack 303, 303b, or 303c. The distance can be in the range of 30 to 150 microns. For example, the distance can be in the range of 50 to 100 microns. In a further example, the distance can be about 30, 40, 50, 60, 70, 80, 90, 100, 110, 120, 130, 140 or 150 microns. In some embodiments, the distance can be greater than 30, 40, 50, 60, 70, 80, 90, 100, 110, 120, 130, 140 or 150 microns. In some embodiments, the distance can be no more than 30, 40, 50, 60, 70, 80, 90, 100, 110, 120, 130, 140 or 150 microns.

As can be seen with reference to FIG. 4A, for example, assembly 400 includes a controller die 410, which can be located conveniently between the first stack 302 and the second stack 303 on a substrate 401. The controller die 410 can be electrically coupled to the substrate 401 via wirebonds 421. In another example, such as in FIG. 4B, assembly 400b includes the controller die 410, which can be located conveniently between the first stack 302 and the second stack 303b. In a further example, such as in FIG. 4C, assembly 400c includes the controller die 410, which can be located conveniently between the first stack 302 and the second stack 303c. In some embodiments, other suitable device hardware can be disposed between the first stack 302 and the second stack 303, 303b, or 303c.

Figure 5:
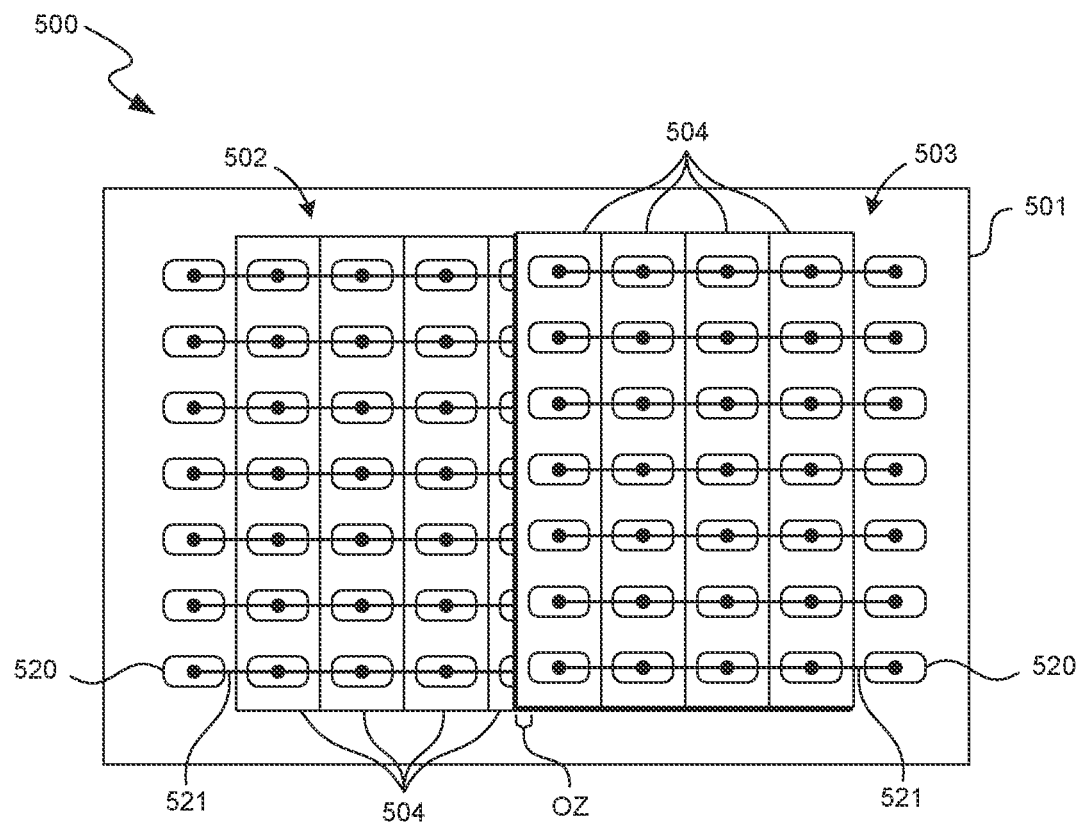
FIG. 5 illustrates a simplified plan view of a semiconductor device assembly including overlapping stacks of semiconductor dies in accordance with an embodiment of the present technology.

FIG. 5 illustrates a simplified plan view of a semiconductor device assembly 500 ("assembly 500") including overlapping stacks of semiconductor dies in accordance with an embodiment of the present technology. The assembly 500 includes a substrate 501, a first stack 502 of semiconductor dies 504 ("dies 504"), and a second stack 503 of the dies 504. The first stack 502 is disposed in a first location on the substrate 501, and the second stack 503 is disposed in a second location offset from the first. A portion of the second stack 503 overlaps a portion of the first stack 502 in an overlap zone "OZ." Each of the first and second stacks 502 and 503 includes four dies 504. In other embodiments, each of the first and second stacks 502 and 503 can include six, eight, or any other suitable number of dies 504. In other embodiments, the number of dies 504 of the first stack 502 can be different than the number of dies 504 of the second stack 503. The bottommost die of each stack 502 and 503 is directly coupled to the substrate 501, and each die 504 in each stack 502 and 503, other than the bottommost die, is laterally offset from immediately adjacent dies 504. The offset direction of each die 504 of the first stack 502 is opposite to the offset direction of each die 504 of the second stack 503. The offset distance can be about equal throughout a stack or can vary within a stack.

The assembly 500 further includes wirebonds 521 electrically coupling each die 504 in each stack 502 and 503 to each other and/or to the substrate 501 either directly or indirectly. More particularly, wirebonds 521 electrically couple the dies 504 in each stack 502 and 503 to corresponding bond pads 520 on the substrate 501. Because an edge portion of the dies 504 in either stack 502 and 503 are under an overhang of another die 504 (e.g., unlike in FIGS. 1 and 2), the wirebonds 521 can be formed in a single operation (e.g., uninterrupted by another stacking operation), and each bond pad 520 can be connected to only a single wirebond 521.

As set forth above, the semiconductor dies in a semiconductor device assembly can include dies that provide a variety of different functions (e.g., logic, memory, sensors, etc.). In an embodiment in which overlapping stacks of memory dies are included in a semiconductor device assembly, an expected advantage of including multiple stacks of memory dies is that different stacks of memory dies can be dedicated to different memory channels (e.g., in a one-to-one relationship where each stack corresponds to one channel, or in an n-to-one or one-to-n relationship in which multiple stacks correspond to each channel, or even multiple channels to each stack).

In accordance with one aspect of the subject technology, another expected advantage of providing overlapping stacks of dies in a semiconductor device assembly is that the package height can be reduced, since multiple stacks of fewer dies per stack can be used instead of a single, taller stack with the same total number of dies. Another expected advantage is that thicker semiconductor dies can be used in the two die stacks compared to a single die stack with the same number of total dies, since the overall height is less for devices in accordance with the present technology. This is expected to simplify manufacturing because thicker dies are easier to handle and process than very thin dies.

According to one aspect of the subject technology, an additional expected advantage of overlapping stacks of semiconductor dies in a semiconductor device assembly, as opposed to a single, larger stack, is that warpage of the assembly is reduced. This is expected to reduce physical stresses on the external contacts of the assembly. In this regard, an assembly with a single stack of dies disposed generally in the middle of the assembly experiences elevated physical stresses (e.g., due to warpage and thermal effects) in a region generally underneath and within the periphery of the stack. This area generally corresponds to a central region of the package substrate where many of the assembly solder joints may be dedicated to signaling and power. Such stresses can reduce the reliability of the solder joints between the assembly and higher-level circuitry (e.g., a module board, package-on-package interposer, or the like). In an assembly with overlapping stacks of dies disposed in different locations on the substrate of the assembly, the physical stresses in the middle of the assembly tend to be lower, with elevated stresses occurring, if at all, in more peripheral regions of the package (e.g., where package contacts may be dedicated merely to mechanical robustness, and where electrical connectivity is not required for successful operation of the assembly).

Yet another expected advantage of the present technology is that the thermal impedance of multiple overlapping stacks of semiconductor dies is expected to be less than that of a single stack with the same number of total dies. The thermal impedance of a stack with fewer dies (e.g., with fewer die-to-die interfaces) is lower than a stack with more dies, even for stacks with thicker dies, since there are fewer thermal barriers caused by the alternating layers of silicon and underfill, tape attach, or other adhesive in the overlapping die stacks. Accordingly, with improved thermal impedance, a semiconductor device assembly with overlapping stacks of semiconductor dies can be operated with a greater input power while performing within an acceptable temperature range, as compared to a semiconductor device assembly with a single stack of more semiconductor dies.

Although in the foregoing examples, semiconductor device assemblies have been illustrated and described as including stacks of semiconductor dies, in other embodiments of the present technology, semiconductor device assemblies can include multiple stacks of semiconductor dies utilizing different topologies (e.g., vertical stacks, etc.) and interconnection technologies (e.g., TSVs, optical interconnections, inductive interconnections, etc.).

Figure 6:
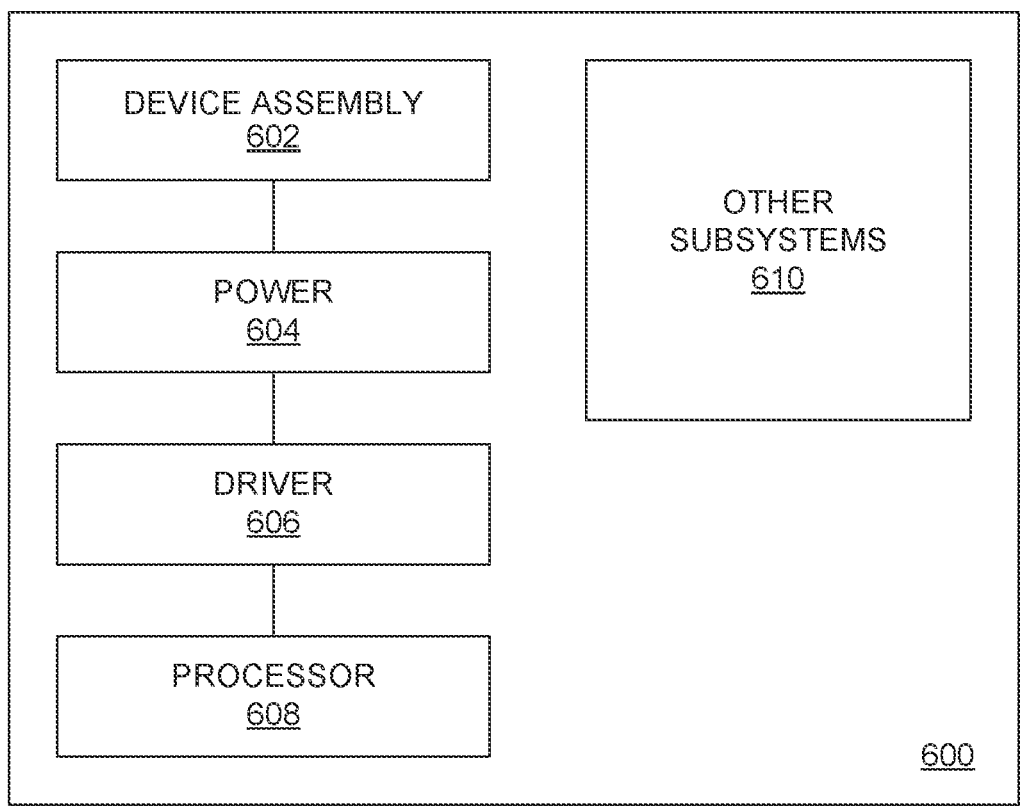
FIG. 6 is a schematic view of a system that includes a semiconductor device or package configured in accordance with embodiments of the present technology.

Any one of the semiconductor device assemblies described above with reference to FIGS. 3A-5 can be incorporated into any of a myriad of larger and/or more complex systems, a representative example of which is system 600 shown schematically in FIG. 6. The system 600 can include a semiconductor device assembly 602, a power source 604, a driver 606, a processor 608, and/or other subsystems or components 610. The semiconductor device assembly 602 can include features generally similar to those of the semiconductor devices described above with reference to FIGS. 3A-5. The resulting system 600 can perform any of a wide variety of functions, such as memory storage, data processing, and/or other suitable functions. Accordingly, representative systems 600 can include, without limitation, hand-held devices (e.g., mobile phones, tablets, digital readers, and digital audio players), computers, vehicles, appliances and other products. Components of the system 600 may be housed in a single unit or distributed over multiple, interconnected units (e.g., through a communications network). The components of the system 600 can also include remote devices and any of a wide variety of computer readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor assembly, comprising:
   a substrate;
   a first stack of semiconductor dies disposed directly over a first location on the substrate;
   a first die attach film disposed between each semiconductor die in the first stack and having a first die attach film thickness;
   a second stack of semiconductor dies disposed directly over a second location on the substrate,
      wherein the first stack includes an uppermost semiconductor die of the first stack, and
      wherein at least a portion of a semiconductor die of the second stack is superimposed above at least a portion of the uppermost semiconductor die of the first stack such that the semiconductor die of the second stack is not physically supported by the first stack; and
   a second die attach film disposed between each semiconductor die in the second stack and having a second die attach film thickness different than the first die attach film thickness.

2. The semiconductor assembly of claim 1 wherein the semiconductor die of the second stack is an uppermost semiconductor die of the second stack.

3. The semiconductor assembly of claim 1, wherein the semiconductor die of the second stack has a smallest lateral distance to the first location among each semiconductor die of the second stack.

4. The semiconductor assembly of claim 1, further comprising a dielectric spacer, controller die, or logic die disposed underneath a lowermost semiconductor die of the first stack or second stack.

5. The semiconductor assembly of claim 1 wherein:
   each semiconductor die of the first stack includes a first die thickness; and
   each semiconductor die of the second stack includes a second die thickness different than the first die thickness.

6. The semiconductor assembly of claim 1, further comprising:
   a controller die disposed on the substrate between the first stack and second stack; and
   a spacer within the second stack.

7. The semiconductor assembly of claim 1 wherein:
the first stack includes a lowermost semiconductor die of the first stack and at least one upper semiconductor die stacked over the lowermost semiconductor die of the first stack; and
each upper semiconductor die of the first stack is offset from a semiconductor die directly below by a first offset in a first direction.

8. The semiconductor assembly of claim 7, wherein:
the second stack includes a lowermost semiconductor die of the second stack and at least one upper semiconductor die stacked over the lowermost semiconductor die of the second stack; and
each upper semiconductor die of the second stack is offset from a semiconductor die directly below by a second offset in a second direction substantially opposite to the first direction.

9. The semiconductor assembly of claim 1 wherein:
the first stack of semiconductor dies is electrically connected to a first subset of external connections by a first plurality of wirebonds; and
the second stack of semiconductor dies is electrically connected to a second subset of external connections by a second plurality of wirebonds.

10. A semiconductor assembly, comprising:
a substrate;
a first stack of semiconductor dies disposed directly over a first location on the substrate;
a first die attach film disposed between each semiconductor die in the first stack and having a first die attach film thickness;
a second stack of semiconductor dies disposed directly over a second location on the substrate,
wherein the first stack includes an uppermost semiconductor die of the first stack,
wherein the second stack includes a nearest semiconductor die having a smallest lateral distance to the first location among each semiconductor die of the second stack, and
wherein at least a portion of the uppermost semiconductor die of the first stack is superimposed above at least a portion of the nearest semiconductor die of the second stack such that the uppermost semiconductor die of the first stack is not physically supported by the second stack; and
a second die attach film disposed between each semiconductor die in the second stack and having a second die attach film thickness different than the first die attach film thickness.

11. The semiconductor assembly of claim 10, wherein the nearest semiconductor die of the second stack is an uppermost semiconductor die of the second stack.

12. The semiconductor assembly of claim 10 wherein:
each semiconductor die of the first stack includes a first die thickness; and
each semiconductor die of the second stack includes a second die thickness different than the first die thickness.

13. The semiconductor assembly of claim 10, further comprising a controller die disposed on the substrate between the first stack and second stack.

14. The semiconductor assembly of claim 10 wherein:
the first stack includes a lowermost semiconductor die of the first stack and at least one upper semiconductor die stacked over the lowermost semiconductor die of the first stack; and
each upper semiconductor die of the first stack is offset from a semiconductor die directly below by a first offset in a first direction.

15. The semiconductor assembly of claim 14 wherein:
the second stack includes a lowermost semiconductor die of the second stack and at least one upper semiconductor die stacked over the lowermost semiconductor die of the second stack; and
each upper semiconductor die of the second stack is offset from a semiconductor die directly below by a second offset in a second direction substantially opposite to the first direction.

16. The semiconductor assembly of claim 10 wherein:
the first stack of semiconductor dies is electrically connected to a first subset of external connections by a first plurality of wirebonds; and
the second stack of semiconductor dies is electrically connected to a second subset of external connections by a second plurality of wirebonds.

17. A method of manufacturing a semiconductor assembly, the method comprising:
providing a substrate;
stacking, over a first location on the substrate, a first plurality of semiconductor dies in a first stack, the first stack including an uppermost semiconductor die, wherein the first plurality of semiconductor dies are each attached by a first die attach film having a first thickness; and
stacking, over a second location on the substrate, a second plurality of semiconductor dies in a second stack,
wherein the second plurality of semiconductor dies are each attached by a second die attach film having a second thickness different than the first thickness,
wherein at least a portion of a semiconductor die of the second stack is superimposed above at least a portion of the uppermost semiconductor die of the first stack such that the semiconductor die of the second stack is not physically supported by the first stack.

18. The method of claim 17, further comprising:
wirebonding the first and second pluralities of semiconductor dies to the substrate; and
providing an encapsulant to at least partially encapsulate the substrate, the first stack and the second stack.

19. The method of claim 18, wherein the wirebonding includes:
wirebonding, subsequent to stacking the first and second stacks, the first and second pluralities of semiconductor dies to a first subset of external connections and a second subset of external connections, respectively.

20. The method of claim 17, further comprising:
disposing a spacer at the second location on the substrate.

* * * * *